US012713619B2

(12) United States Patent
Bae et al.

(10) Patent No.: US 12,713,619 B2
(45) Date of Patent: Aug. 18, 2026

(54) SEMICONDUCTOR DEVICE

(71) Applicant: Samsung Electronics Co., Ltd., Suwon-si (KR)

(72) Inventors: Byoungjae Bae, Suwon-si (KR); Seungpil Ko, Suwon-si (KR); Inho Kim, Suwon-si (KR); Hyungjong Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 603 days.

(21) Appl. No.: 18/300,021

(22) Filed: Apr. 13, 2023

(65) Prior Publication Data

US 2024/0074208 A1 Feb. 29, 2024

(30) Foreign Application Priority Data

Aug. 26, 2022 (KR) ........................ 10-2022-0107547

(51) Int. Cl.
*H10B 61/00* (2023.01)

(52) U.S. Cl.
CPC .................................... *H10B 61/00* (2023.02)

(58) Field of Classification Search
CPC ........... H01L 23/5226; H01L 21/3065; H10W 20/435; H10W 20/425; H10W 20/42; H10W 20/48
See application file for complete search history.

(56) References Cited

U.S. PATENT DOCUMENTS

| | | | | |
|---|---|---|---|---|
| 8,815,734 | B2 | 8/2014 | Cheng et al. | |
| 9,748,105 | B2 | 8/2017 | Wu et al. | |
| 9,997,407 | B2 | 6/2018 | Basker et al. | |
| 2012/0252191 | A1 | 10/2012 | Bhat et al. | |
| 2021/0159272 | A1* | 5/2021 | Cho | H10N 50/80 |
| 2021/0375626 | A1 | 12/2021 | Anglin et al. | |
| 2023/0111315 | A1* | 4/2023 | Huang | H01L 23/53266 257/750 |

FOREIGN PATENT DOCUMENTS

| | | | |
|---|---|---|---|
| JP | H11-140640 | A | 5/1999 |
| KR | 100639457 | B1 | 10/2006 |
| KR | 100875073 | B1 | 12/2008 |
| KR | 10-2009-0077157 | A | 7/2009 |
| KR | 100972704 | B1 | 7/2010 |
| KR | 10-2021-0012084 | A | 2/2021 |
| KR | 10-2021-0063528 | A | 6/2021 |

* cited by examiner

*Primary Examiner* — Shih Tsun A Chou
(74) *Attorney, Agent, or Firm* — Fish & Richardson P.C.

(57) ABSTRACT

A semiconductor device includes an etch stop layer, an insulating layer on the etch stop layer, and a contact structure passing through the etch stop layer and the insulating layer, the contact structure including a first conductive layer, a second conductive layer having a side surface and a lower surface facing the first conductive layer, a third conductive layer on an upper surface of the second conductive layer, and a natural oxide film between the first conductive layer and the second conductive layer and between the second conductive layer and the third conductive layer, the first to third conductive layers including metal or metal nitride, and the natural oxide film including metal oxide.

20 Claims, 15 Drawing Sheets

SEMICONDUCTOR DEVICE

CROSS-REFERENCE TO RELATED APPLICATION(S)

This application claims benefit of priority to Korean Patent Application No. 10-2022-0107547 filed on Aug. 26, 2022 in the Korean Intellectual Property Office, the disclosure of which is incorporated herein by reference in its entirety.

BACKGROUND

The present inventive concepts relates to semiconductor devices.

Magnetoresistive memory devices are non-volatile memory devices that read and write data using a magnetic tunnel junction pattern including two magnetic members and an insulating layer interposed therebetween. A resistance value of the magnetic tunnel junction pattern may vary according to a magnetization direction of the two magnetic members, and data may be programmed or erased using the difference in resistance values.

SUMMARY

Some aspects of the present inventive concepts are to provide semiconductor devices having improved electrical characteristics and reliability.

According to some aspects of the present inventive concepts, a semiconductor device includes an etch stop layer; an insulating layer on the etch stop layer; and a contact structure passing through the etch stop layer and the insulating layer, the contact structure includes a first conductive layer, a second conductive layer having a side surface and a lower surface facing the first conductive layer, a third conductive layer on an upper surface of the second conductive layer, and a natural oxide film between the first conductive layer and the second conductive layer and between the second conductive layer and the third conductive layer, the first to third conductive layers including metal or metal nitride, and the natural oxide film including metal oxide.

According to some aspects of the present inventive concepts, a semiconductor device includes a substrate; a lower structure on the substrate; an etch stop layer on the lower structure; an insulating layer on the etch stop layer; a contact structure passing through the etch stop layer and the insulating layer; and an information storage structure including a lower electrode, a magnetic tunnel junction pattern, and an upper electrode sequentially stacked on the contact structure, and the contact structure including a first conductive layer, a second conductive layer in an opening passing through the first conductive layer, a third conductive layer on the second conductive layer in the opening, and a natural oxide film surrounding the second conductive layer.

According to some aspects of the present inventive concepts, a semiconductor device includes a wiring; an insulating layer on the wiring; and a contact structure passing through the insulating layer, the contact structure including a first conductive layer, a second conductive layer in an opening passing through the first conductive layer, a third conductive layer on the second conductive layer in the opening, and a natural oxide film surrounding the second conductive layer, the first to third conductive layers including metal or metal nitride, the natural oxide layer including metal oxide, and the wiring being in contact with the first conductive layer and electrically connected to the second and third conductive layers.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
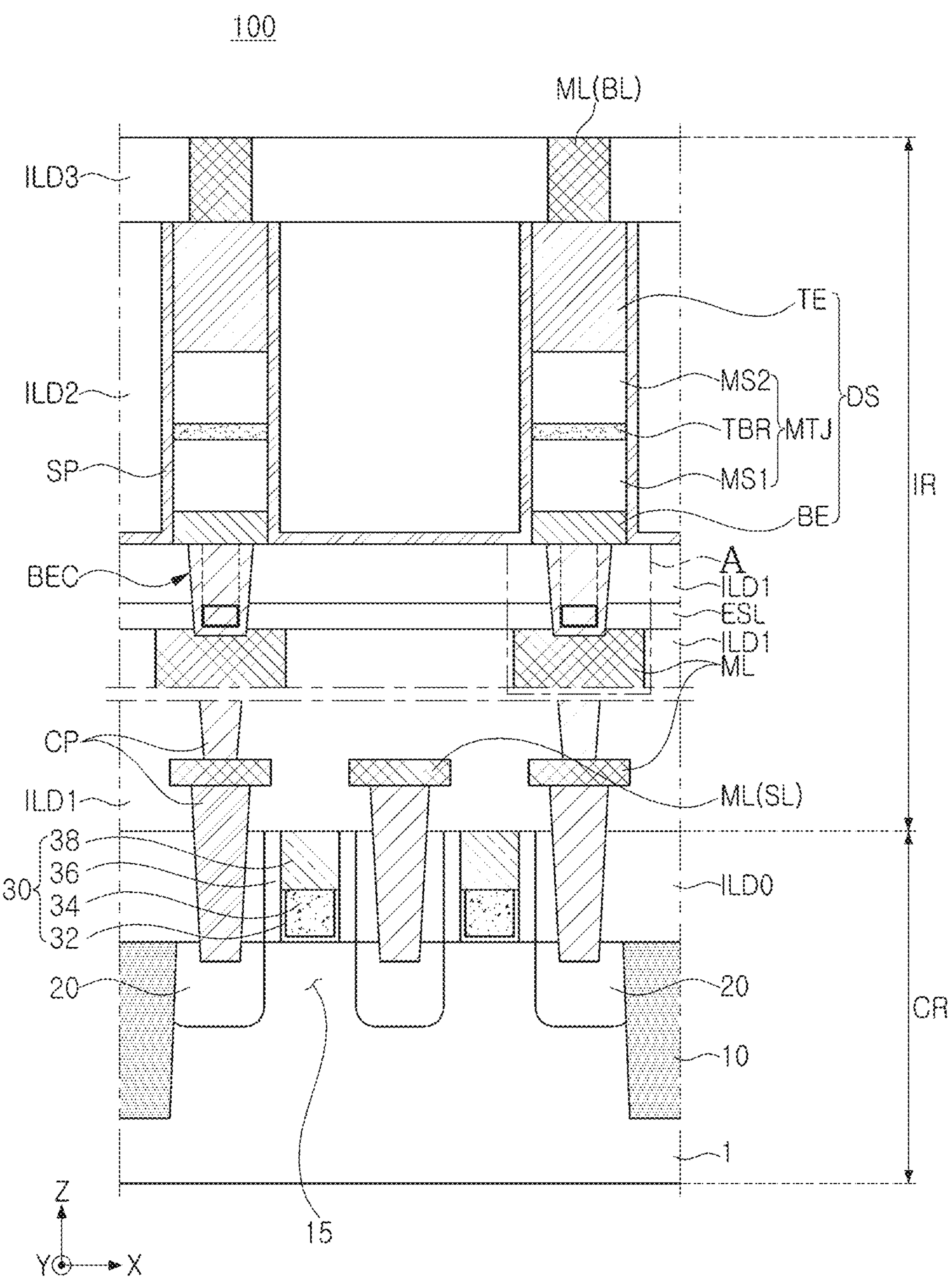
FIG. 1 is a schematic cross-sectional view of a semiconductor device according to some example embodiments of the present inventive concepts.

FIG. 1 is a schematic cross-sectional view of a semiconductor device 100 according to some example embodiments.

Figure 2:
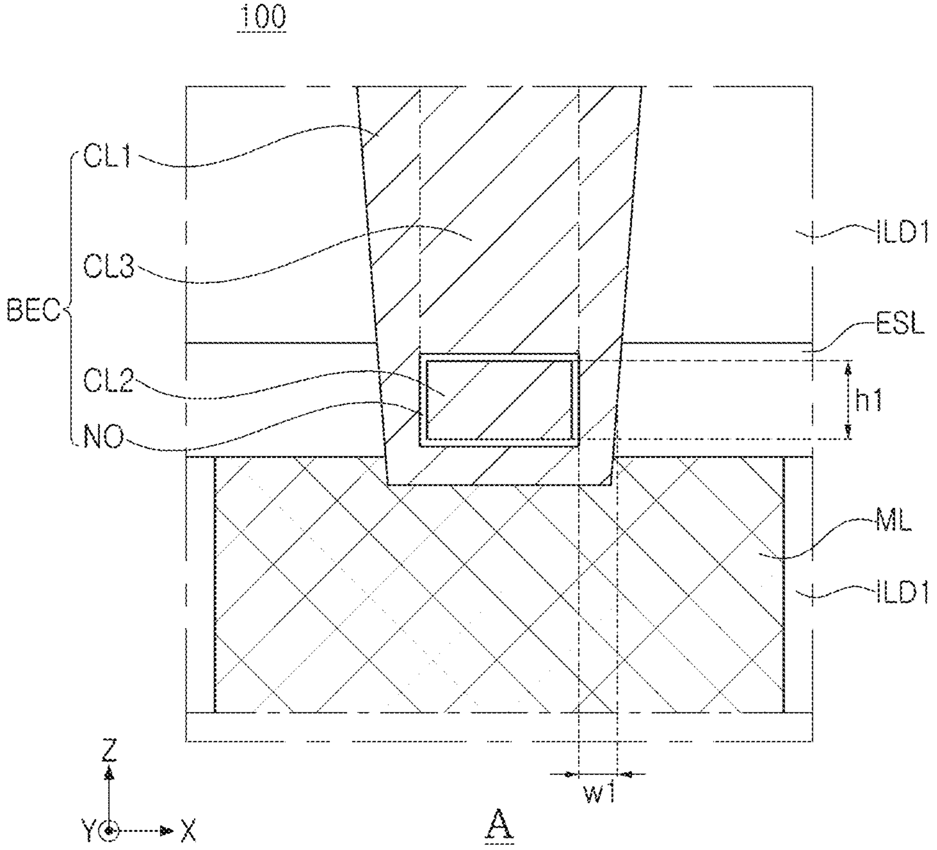
FIG. 2 is a partially enlarged view of a semiconductor device according to some example embodiments of the present inventive concepts.

FIG. 2 is a partially enlarged view of the semiconductor device 100 according to some example embodiments. FIG. 2 is an enlarged view of region 'A' of FIG. 1.

Referring to FIGS. 1 and 2, a semiconductor device 100 including a magnetic tunnel junction pattern MTJ may be provided. The semiconductor device 100 may include a substrate 1, a logic circuit region CR on the substrate, and a wiring region IR on the logic circuit region CR.

The logic circuit region CR may include an active region 15 defined by a device isolation layer 10 in the substrate 1, the gate structure 30 on the active region 15, and impurity regions 20 disposed in the region 15 on both sides of the gate structure 30. For example, the logic circuit region CR may include a planar transistor or a FinFET in which the active region 15 has a fin structure. In another example, the logic circuit region CR may include a multi bridge channel FET (MBCFET) or a gate-all-around field effect transistor (GAAFET), or a nanosheet transistor. In another example, the logic circuit region CR may include a buried channel array transistor (BCAT) centered around a buried gate structure intersecting the active region 15 and is buried and extended in the substrate 1.

The substrate 1 may include a semiconductor material, such as a group IV semiconductor, a group III-V compound semiconductor, and/or a group II-VI compound semiconductor. For example, the group IV semiconductor may include silicon, germanium, or silicon-germanium. The substrate 1 may further include impurities. The substrate 1 may be a silicon substrate, a silicon on insulator (SDI) substrate, a germanium substrate, a germanium-on-insulator (GOI) substrate, a silicon-germanium substrate, or substrate including an epitaxial layer.

The device isolation layer 10 may define the active region 15 on the substrate 1. The device isolation layer 10 may be formed by, for example, a shallow trench isolation (STI) process. The device isolation layer 10 may include an insulating material, for example, at least one of silicon oxide, silicon nitride, silicon oxynitride, and silicon oxycarbide. The active region 15 is defined by the device isolation layer 10 and may extend in one direction. The active region 15 may have a structure protruding from the substrate 1.

The impurity regions 20 may be disposed in the active region 15 on both sides of the gate structure 30. The impurity regions 20 may be provided as source regions or drain regions of transistors. The impurity regions 20 may include N-type or P-type impurities. The impurity regions 20 may be epitaxial layers grown from a region in which a fin pattern of the active region 15 is partially removed.

The gate structure 30 may extend in a direction crossing the active region 15. The gate structure 30 may include a gate dielectric layer 32, a gate electrode 34, a gate spacer 36, and a gate capping layer 38.

The gate dielectric layer 32 may be disposed between the active region 15 and the gate electrode 34 and may include oxide, nitride, or a high-k material. The high-k material may refer to a dielectric material having a higher dielectric constant than that of silicon oxide ($SiO_2$).

The gate electrode 34 may include a conductive material, and may include, for example, at least one of W, Ti, Ta, Mo, TiN, TaN, WN, TiON, TiAlC, TiAlN, and TaAlC. The gate electrode 34 may include a semiconductor material, such as doped polysilicon. The gate electrode 34 may include two or more multilayer structures.

The gate spacers 36 may be disposed on both sides of the gate electrode 34. The gate spacer 36 may include at least one of SiO, SiN, SiCN, SiOC, SiON, and SiOCN, and may include a plurality of layers.

The gate capping layer 38 may be disposed on an upper surface of the gate electrode 34 and may be formed of, for example, silicon oxide, silicon nitride, silicon oxynitride, or combinations thereof.

The wiring region IR may include contact plugs CP and wirings ML electrically connected to the impurity regions 20. Some of the contact plugs CP may extend into an interlayer insulating layer ILD0 in the logic circuit region CR and be directly connected to the impurity regions 20 or directly connected to the gate electrode 34. The contact plugs CP and wirings ML may be disposed in a first interlayer insulating layer ILD1 including a plurality of insulating layers. Some of the contact plugs CP may be directly connected to a lower electrode BE. The wirings ML may include source lines SL. The wirings ML may include bit lines BL disposed in a third interlayer insulating layer ILD3 on the information storage structure DS.

The information storage structure DS may be disposed in the wiring region IR. A plurality of information storage structures DS may be provided, and the information storage structures DS may be spaced apart from each other in an X-direction (e.g., a first horizontal direction). The information storage structures DS may be respectively disposed on contact structures BEC and may be respectively connected to the contact structures BEC. The information storage structure DS may include the lower electrode BE, the magnetic tunnel junction pattern MTJ, and an upper electrode TE sequentially stacked on the contact structure BEC. The lower electrode BE may be disposed between the contact structure BEC and the magnetic tunnel junction pattern MTJ, and the magnetic tunnel junction pattern MTJ may be disposed between the lower electrode BE and the upper electrode TE. The magnetic tunnel junction pattern MTJ may include a first magnetic structure MS1, a second magnetic structure MS2, and a tunnel barrier pattern TBR therebetween. The first magnetic structure MS1 may be disposed between the lower electrode BE and a tunnel barrier pattern TBR, and the second magnetic structure MS2 may be disposed between the upper electrode TE and the tunnel barrier pattern TBR. The lower electrode BE may include, for example, conductive metal nitride (e.g., titanium nitride or tantalum nitride). The upper electrode TE may include at least one of a metal (e.g., Ta, W, Ru, Ir, etc.) and conductive metal nitride (e.g., TiN). A lower surface of the contact structure BEC may contact a corresponding wiring ML, and an upper surface of the contact structure BEC may contact a lower surface of the lower electrode BE of the information storage structure DS. The spacers SP are disposed in a second interlayer insulating layer ILD2 and may cover side surfaces of the information storage structure DS. The spacers SP may prevent or reduce oxidation of a material layer constituting the magnetic tunnel junction pattern MTJ of the information storage structure DS.

The contact structure BEC may be disposed on the substrate 1. The contact structure BEC may be disposed in the wiring region IR. The contact structures BEC may be spaced apart from each other in the X-direction. The contact structure BEC may be disposed in the first interlayer insulating layer ILD1. Each of the contact structures BEC may pass through the first interlayer insulating layer ILD1 and the etch stop layer ESL. The contact structure BEC may vertically overlap (e.g., in the Z-direction, or vertical direction) the magnetic tunnel junction pattern MTJ.

As illustrated in FIG. 2, the contact structure BEC may include a first conductive layer CL1, a second conductive layer CL2, a third conductive layer CL3, and a natural oxide layer NO. The second conductive layer CL2 and the third conductive layer CL3 may be disposed in the opening passing through the first conductive layer CL1. The first conductive layer CL1 may be in a recess an upper portion of the wiring ML disposed below the contact structure BEC. The second conductive layer CL2 may have side and lower surfaces facing the first conductive layer CL1. The second conductive layer CL2 may horizontally overlap the etch stop layer ESL. A height h1 of the second conductive layer CL2 may range from about 25% to about 200% of a width w1 of the first conductive layer CL1. The third conductive layer CL3 may have a side surface facing the first conductive layer CL1 and a lower surface facing the second conductive layer CL2. An upper surface of the third conductive layer CL3 may be positioned on substantially the same level as that of an upper surface of the first conductive layer CL1. A distance between the lower surface of the magnetic tunnel junction pattern MTJ and the lower surface of the second conductive layer CL2 may be greater than a distance between the lower surface of the magnetic tunnel junction pattern MTJ and the lower surface of the third conductive layer CL3. The natural oxide layer NO may be disposed between the first conductive layer CL1 and the second conductive layer CL2 and between the second conductive layer CL2 and the third conductive layer CL3. The natural oxide layer NO may surround the second conductive layer CL2. The natural oxide layer NO may horizontally overlap the etch stop layer ESL. A thickness of the natural oxide layer NO may range from about 5 Å to about 200 Å, or may range from about 20 Å to about 100 Å.

During the manufacturing process of the semiconductor device 100, in etching an overhang of the first conductive layer CL1, an etching by-product may fall into the opening of the first conductive layer CL1, thereby forming the second conductive layer CL2. As the second conductive layer CL2 is exposed to the air, the second conductive layer CL2 may be oxidized to form the natural oxide layer NO.

The first to third conductive layers CL1, CL2, and CL3 may include metal or metal nitride. For example, the first to third conductive layers CL1, CL2, and CL3 may include tungsten, copper, aluminum, tungsten nitride, tantalum nitride, titanium nitride, or combinations thereof. The second and third conductive layers CL2 and CL3 may include the same material as that of the first conductive layer CL1. The natural oxide layer NO may include metal oxide. For example, the natural oxide layer NO may include tungsten oxide, tantalum oxide, titanium oxide, or combinations thereof. The natural oxide layer NO may include a metal oxide of the same metal material as metal nitride included in the first to third conductive layers CL1, CL2, and CL3. For example, the first to third conductive layers CL1, CL2, and CL3 may include titanium nitride, and the natural oxide layer NO may include titanium oxide.

Each of the contact structures BEC may be connected to a corresponding one of the wirings ML. The wiring ML may contact the first conductive layer CL1 and be electrically connected to the second and third conductive layers CL2 and CL3. The wirings ML may include a metal material, for example, tungsten, copper, aluminum, or combinations thereof.

Figure 3:
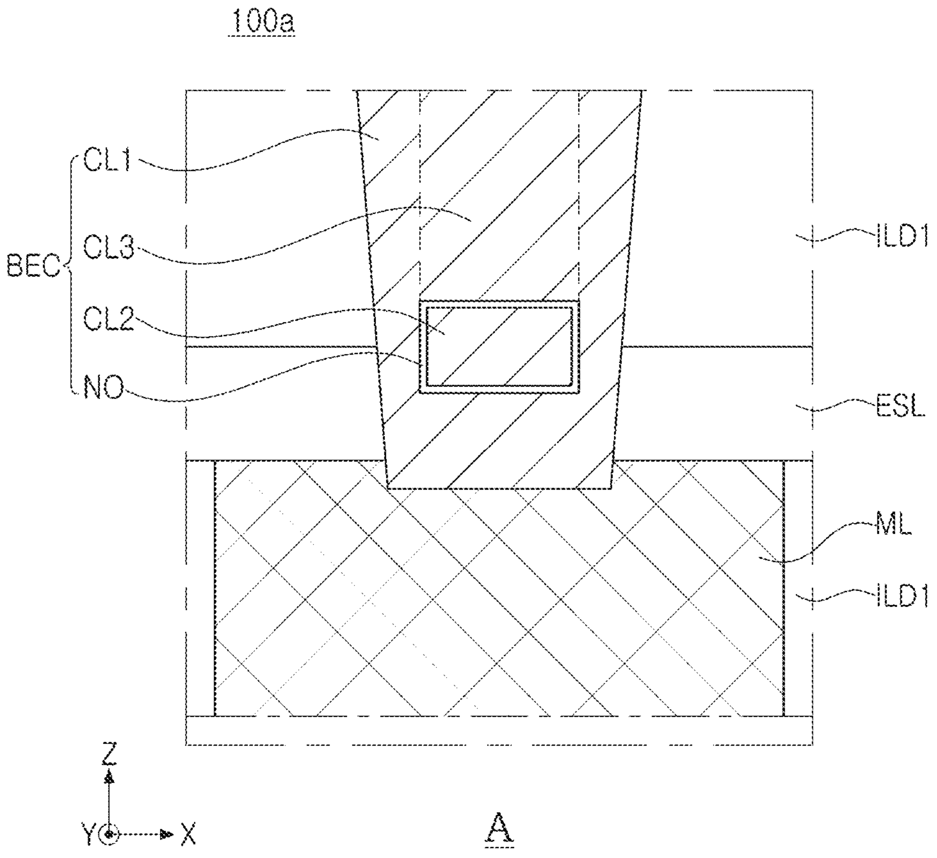
FIG. 3 is a partially enlarged view of a semiconductor device according to some example embodiments of the present inventive concepts.

FIG. 3 is a partially enlarged view of the semiconductor device 100*a* according to some example embodiments. FIG. 3 illustrates a region corresponding to FIG. 2.

Referring to FIG. 3, unlike the example embodiments of FIGS. 1 and 2, the second conductive layer CL2 may horizontally overlap the etch stop layer ESL and the first interlayer insulating layer ILD1. The natural oxide layer NO may horizontally overlap the etch stop layer ESL and the first interlayer insulating layer ILD1. Depending on a level of a lower surface of the opening of the first conductive layer CL1, the level of the lower surface of each of the second conductive layer CL2 and the natural oxide layer NO may vary.

Except for this, it may be understood that the semiconductor device 100*a* according to the present example embodiments has a structure similar to that of the semiconductor device 100 illustrated in FIGS. 1 and 2. In addition, components of the present example embodiments may be understood with reference to descriptions of the components that are the same as or similar to those of the semiconductor device 100 illustrated in FIGS. 1 and 2 unless otherwise stated.

Figure 4:
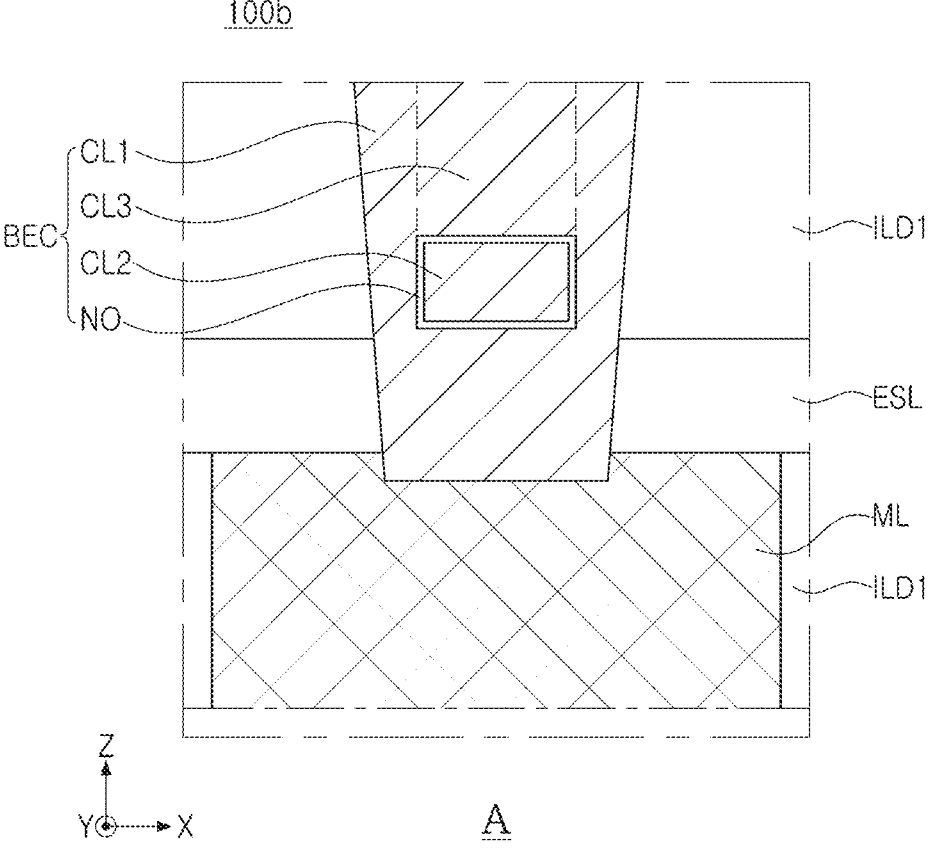
FIG. 4 is a partially enlarged view of a semiconductor device according to some example embodiments of the present inventive concepts.

FIG. 4 is a partially enlarged view of a semiconductor device 100*b* according to some example embodiments. FIG. 4 illustrates a region corresponding to FIG. 2.

Referring to FIG. 4, unlike the example embodiments of FIGS. 1 and 2, the second conductive layer CL2 may horizontally overlap the first interlayer insulating layer ILD1. The natural oxide layer NO may horizontally overlap the first interlayer insulating layer ILD1. Depending on the level of the lower surface of the opening of the first conductive layer CL1, the level of the lower surface of each of the second conductive layer CL2 and the natural oxide layer NO may vary.

Except therefor, it may be understood that the semiconductor device 100*b* according to the present example embodiments has a structure similar to that of the semiconductor device 100 illustrated in FIGS. 1 and 2. In addition, components of the present example embodiments may be understood with reference to descriptions of the components that are the same as or similar to those of the semiconductor device 100 illustrated in FIGS. 1 and 2 unless otherwise stated.

Figure 5:
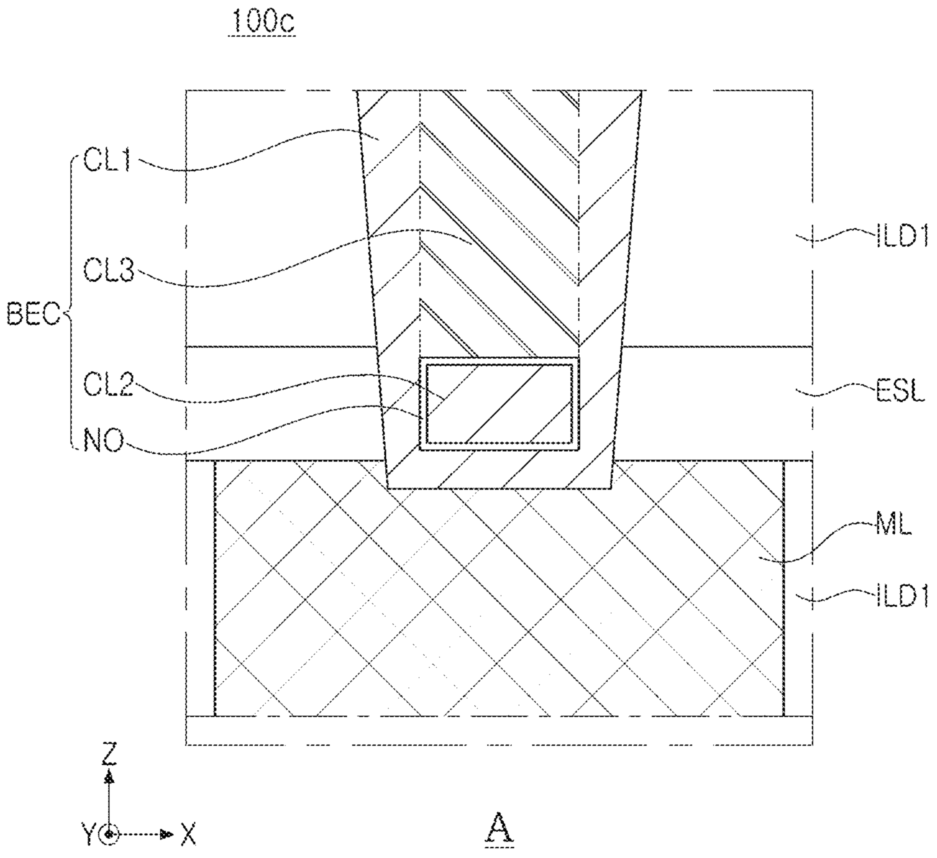
FIG. 5 is a partially enlarged view of a semiconductor device according to some example embodiments of the present inventive concepts.

FIG. 5 is a partially enlarged view of a semiconductor device 100*c* according to some example embodiments. FIG. 5 illustrates a region corresponding to FIG. 2.

Referring to FIG. 5, unlike the example embodiments of FIGS. 1 and 2, the third conductive layer CL3 may include a material different from that of the first and second conductive layers CL1 and CL2. For example, the first and second conductive layers CL1 and CL2 may include tungsten nitride, tantalum nitride, titanium nitride, or combinations thereof, and the third conductive layer CL3 may include tungsten, copper, aluminum, or combinations thereof.

Except for this, it may be understood that the semiconductor device 100*c* according to the present example embodiments has a structure similar to that of the semiconductor device 100 illustrated in FIGS. 1 and 2. In addition, components of the present example embodiments may be understood with reference to descriptions of the components that are same as or similar to those of the semiconductor device 100 illustrated in FIGS. 1 and 2 unless otherwise stated.

Figure 6:
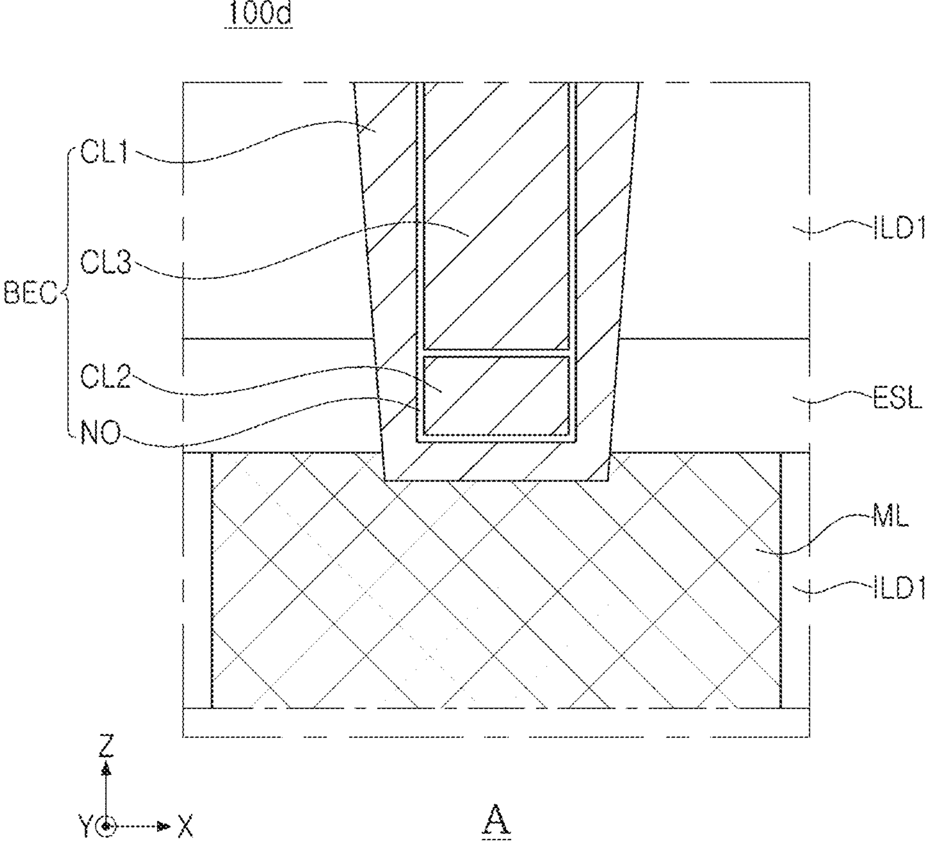
FIG. 6 is a partially enlarged view of a semiconductor device according to some example embodiments of the present inventive concepts.

FIG. 6 is a partially enlarged view of a semiconductor device 100*d* according to some example embodiments. FIG. 6 illustrates a region corresponding to FIG. 2.

Referring to FIG. 6, unlike the example embodiments of FIGS. 1 and 2, the natural oxide layer NO may further include a portion disposed between the first conductive layer CL1 and the third conductive layer CL3. The portion may be formed as a side surface of the opening of the first conductive layer CL1 is exposed to the air and oxidized during the manufacturing process of the semiconductor device 100*d*. The natural oxide layer NO may contact the side surface of the first conductive layer CL1. The natural oxide layer NO may surround the side surface of the third conductive layer CL3.

Except for this, it may be understood that the semiconductor device 100*d* according to the present example embodiments has a structure similar to that of the semiconductor device 100 illustrated in FIGS. 1 and 2. In addition, components of the present example embodiments may be understood with reference to descriptions of the components that are the same as or similar to those of the semiconductor device 100 illustrated in FIGS. 1 and 2 unless otherwise stated.

Figure 7:
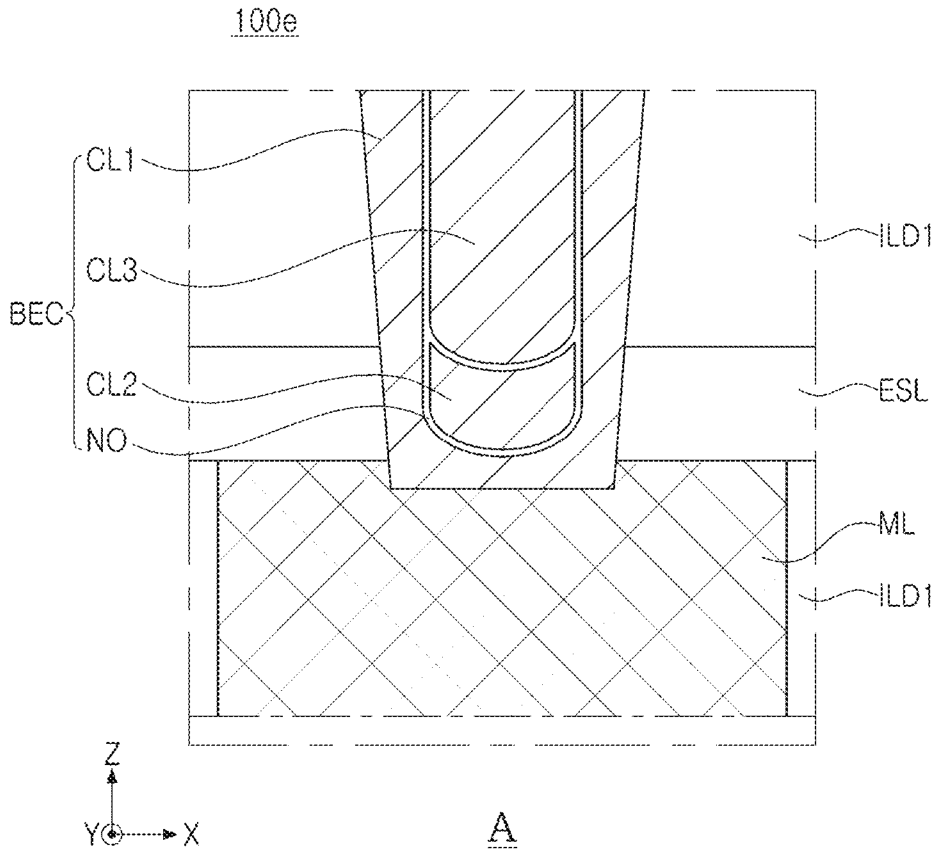
FIG. 7 is a partially enlarged view of a semiconductor device according to some example embodiments of the present inventive concepts.

FIG. 7 is a partially enlarged view of the semiconductor device 100*e* according to some example embodiments. FIG. 7 illustrates a region corresponding to FIG. 2.

Referring to FIG. 7, unlike the example embodiments of FIGS. 1 and 2, upper and lower surfaces of the natural oxide layer NO may have a curved shape convex downward toward the wirings WL. Depending on the degree of convexity of the lower surface of the opening of the first conductive layer CL1, the degree of convexity of the upper and lower surfaces of the natural oxide layer NO may vary.

Except for this, it may be understood that the semiconductor device 100*e* according to the present example embodiments has a structure similar to that of the semiconductor device 100 illustrated in FIGS. 1 and 2. In addition, the components of the present example embodiments may be understood with reference to descriptions of the components that are same as or similar to those of the semiconductor device 100 illustrated in FIGS. 1 and 2 unless otherwise stated.

Figure 8:
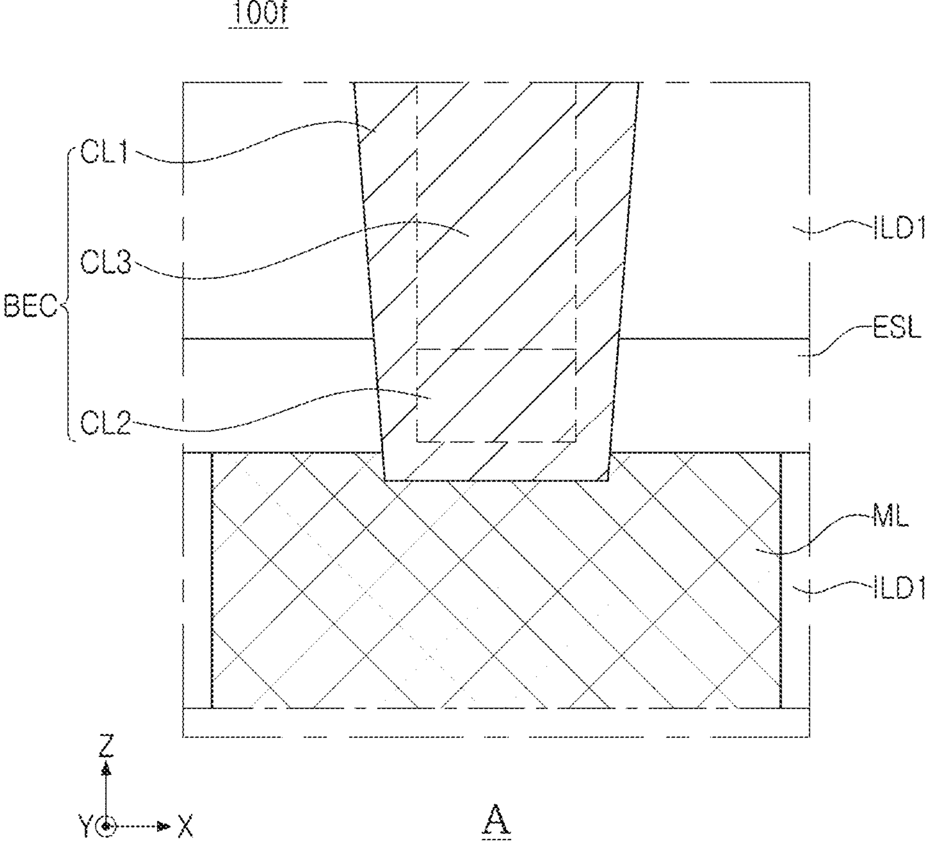
FIG. 8 is a partially enlarged view of a semiconductor device according to some example embodiments of the present inventive concepts.

FIG. 8 is a partially enlarged view of a semiconductor device 100*f* according to some example embodiments. FIG. 8 illustrates a region corresponding to FIG. 2.

Referring to FIG. 8, unlike the example embodiments of FIGS. 1 and 2, the natural oxide layer (NO) may not exist between the first conductive layer CL1 and the second conductive layer CL2 and between the second conductive layer CL2 and the third conductive layer CL3. The second conductive layer CL2 may be integrally connected to the first conductive layer CL1 and the third conductive layer CL3.

Except for this, it may be understood that the semiconductor device 100*f* according to the present example embodiments has a structure similar to that of the semiconductor device 100 illustrated in FIGS. 1 and 2. In addition, the components of the present example embodiments may be understood with reference to descriptions of the components that are same as or similar to those of the semiconductor device 100 illustrated in FIGS. 1 and 2 unless otherwise stated.

Figure 9:
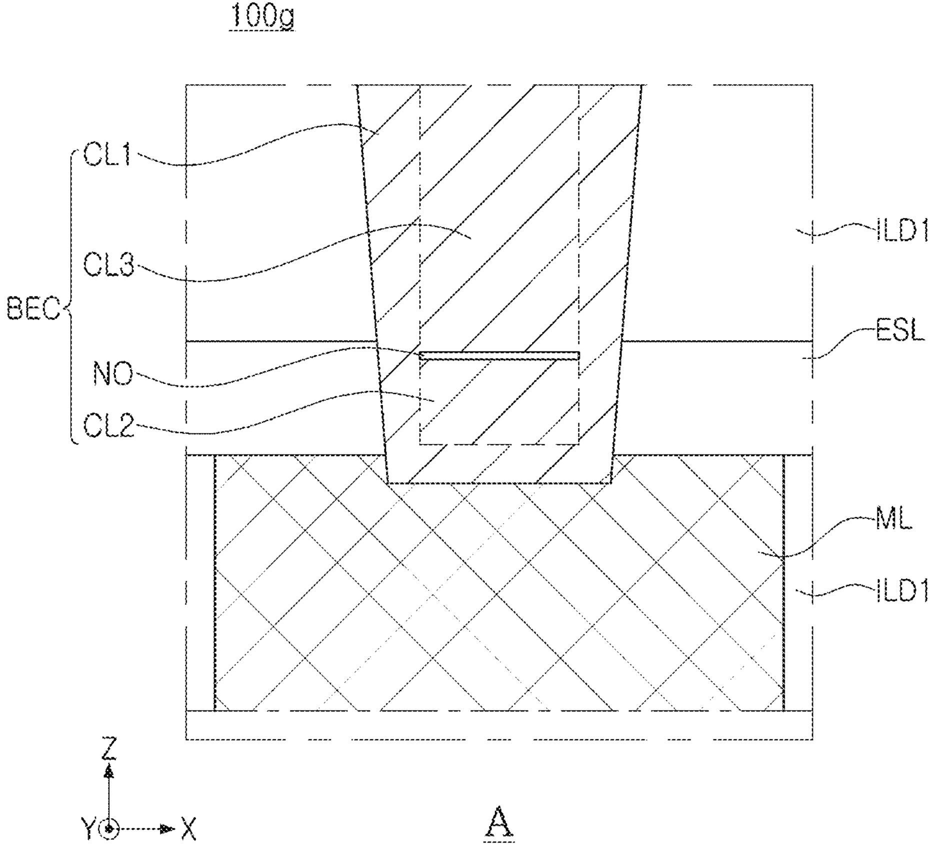
FIG. 9 is a partially enlarged view of a semiconductor device according to some example embodiments of the present inventive concepts.

FIG. 9 is a partially enlarged view of a semiconductor device 100*g* according to some example embodiments. FIG. 9 illustrates a region corresponding to FIG. 2.

Referring to FIG. 9, unlike the example embodiments of FIGS. 1 and 2, the natural oxide layer NO may be disposed only on the upper surface of the second conductive layer CL2 between the second conductive layer CL2 and the third conductive layer CL3. The second conductive layer CL2 may be integrally connected to the first conductive layer CL1. The third conductive layer CL3 may be integrally connected to the first conductive layer CL1.

Except for this, it may be understood that the semiconductor device 100*g* according to the present example embodiments has a structure similar to that of the semiconductor device 100 illustrated in FIGS. 1 and 2. In addition, the components of the present example embodiments may be understood with reference to descriptions of the components that are the same as or similar to those of the semiconductor device 100 illustrated in FIGS. 1 and 2 unless otherwise stated.

Figure 10:
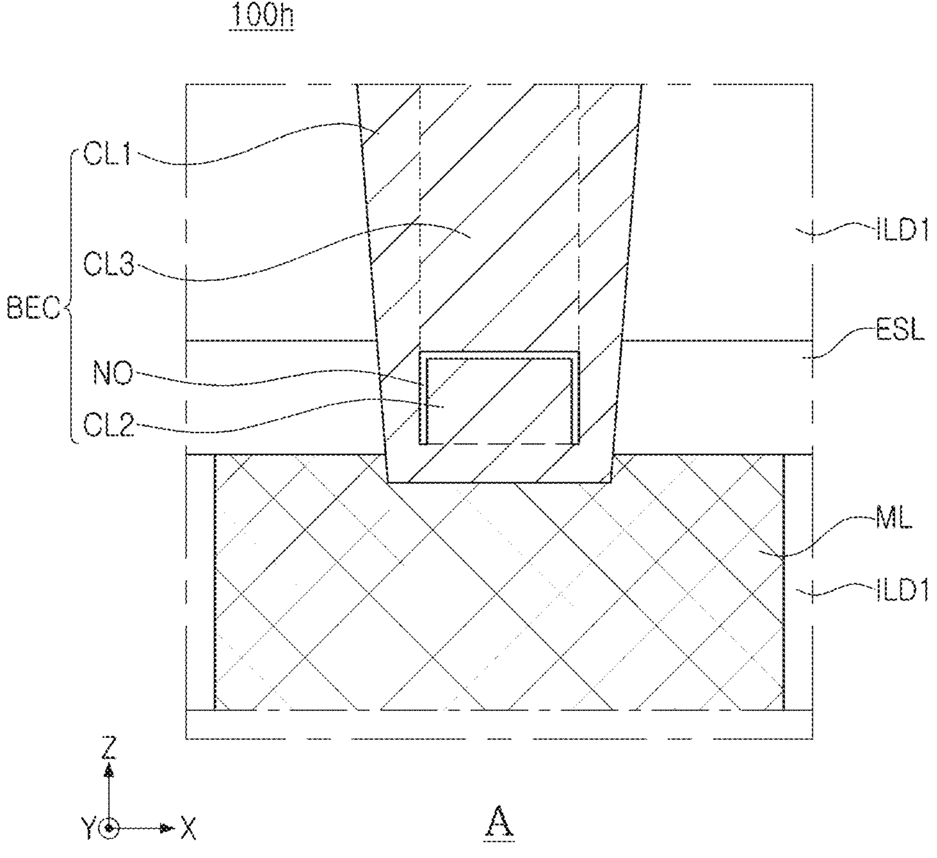
FIG. 10 is a partially enlarged view of a semiconductor device according to some example embodiments of the present inventive concepts.

FIG. 10 is a partially enlarged view of a semiconductor device 100*h* according to some example embodiments. FIG. 7 illustrates a region corresponding to FIG. 2.

Referring to FIG. 10, unlike the example embodiments of FIGS. 1 and 2, the natural oxide layer NO may be disposed only on the upper and side surfaces of the second conductive layer CL2. The second conductive layer CL2 may be integrally connected to the first conductive layer CL1, while side portions of the second conductive layer CL2 are separated from the first conductive layer CL1 by the natural oxide layer NO. The third conductive layer CL3 may be integrally connected to the first conductive layer CL1.

Except for this, it may be understood that the semiconductor device 100*h* according to the present example embodiments has a structure similar to that of the semiconductor device 100 illustrated in FIGS. 1 and 2. In addition, the components of the present example embodiments may be understood with reference to descriptions of the components that are the same as or similar to those of the semiconductor device 100 illustrated in FIGS. 1 and 2 unless otherwise stated.

FIGS. 11A to 11E are schematic partially enlarged views illustrating a method of manufacturing the contact structure BEC according to some example embodiments of the present inventive concepts.

Figure 11A:
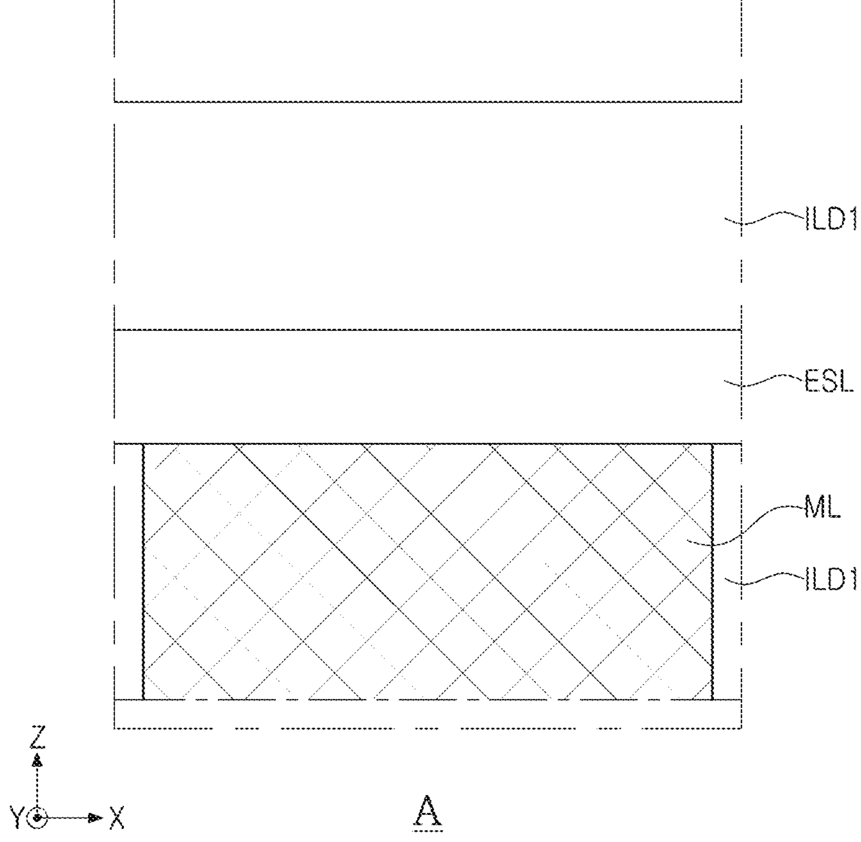
FIGS. 11A to 11E are schematic partially enlarged views illustrating a method of manufacturing a semiconductor device according to some example embodiments.

Referring to FIG. 11A, the first interlayer insulating layer ILD1 may be formed. The first interlayer insulating layer ILD1 may be formed by a physical vapor deposition process (PVD), a chemical vapor deposition process (CVD), an atomic layer deposition (ALD) method, a spin-coating method, or combinations thereof, but is not limited thereto. Next, the wiring ML disposed in the first interlayer insulating layer ILD1 may be formed. The wiring ML may be formed by forming a portion of the first interlayer insulating layer ILD1, removing the portion by etching, and filling the etched portion with a conductive material. Next, the etch stop layer ESL disposed on the wiring ML may be formed. The etch stop layer ESL may be formed by a physical vapor deposition process (PVD), chemical vapor deposition process (CVD), atomic layer deposition (ALD), spin-coating method, or combinations thereof, but is not limited thereto. Next, the first interlayer insulating layer ILD1 may be formed on the etch stop layer ESL.

Figure 11B:
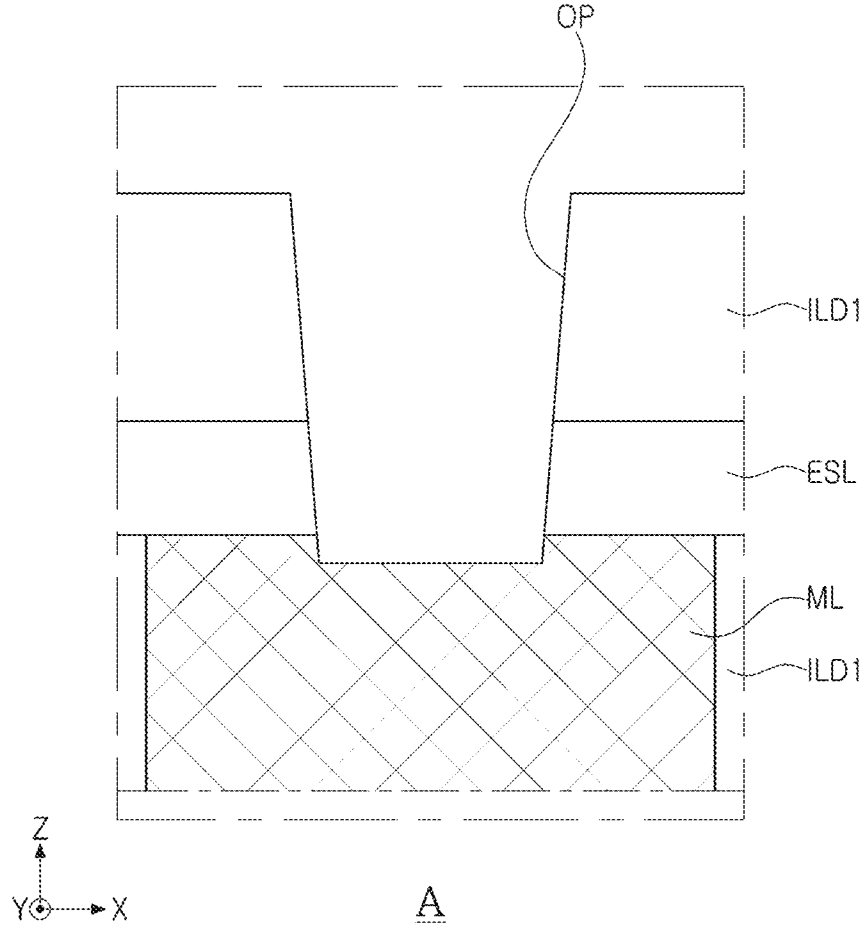

Referring to FIG. 11B, an opening OP passing through the first interlayer insulating layer ILD1 and the etch stop layer ESL and recessing an upper portion of the wiring ML may be formed. The opening OP may be formed by removing a portion of the first interlayer insulating layer ILD1 by performing a photolithography process and an etching process. In this case, the etch stop layer ESL may serve as an etch stopper.

Figure 11C:
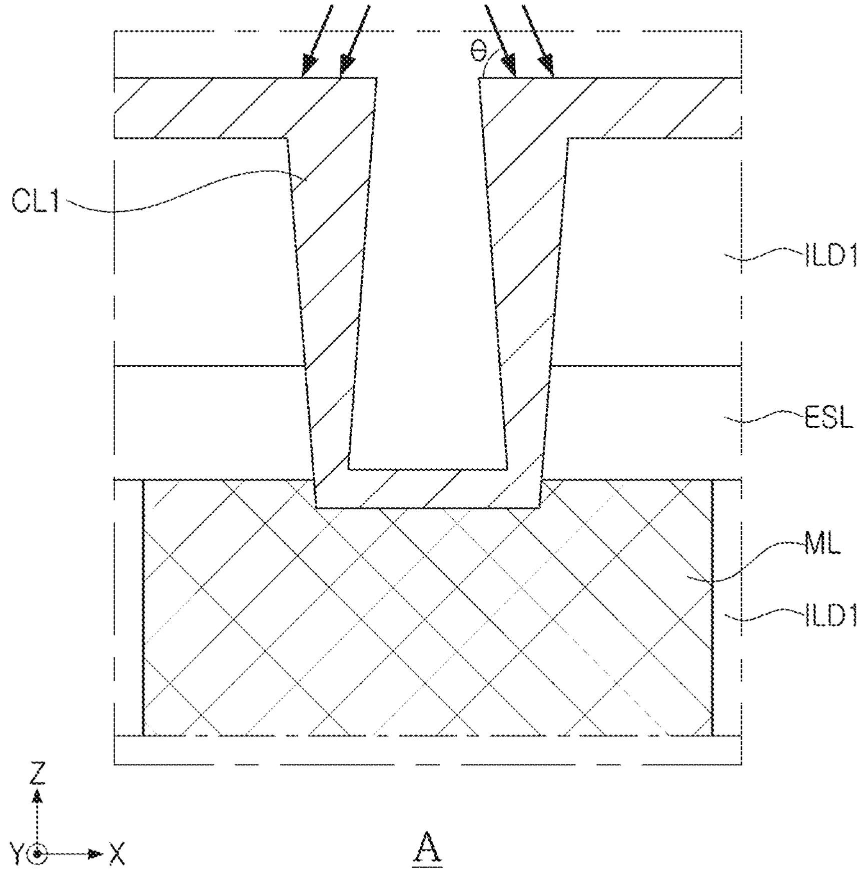

Referring to FIG. 11C, the first conductive layer CL1 may be formed. The first conductive layer CL1 may be formed by a physical vapor deposition process (PVD), a chemical vapor deposition process (CVD), an atomic layer deposition (ALD) method, a spin-coating method, or combinations thereof, but is not limited thereto. In the process of depositing the first conductive layer CL1, an overhang may occur in which a larger amount is deposited at the upper edge of the opening OP than in other regions. For example, larger amounts of the material deposited to form the first conductive layer CL1 may grow (or be deposited, etc.) at an upper edge of the opening OP and create an overhang of material that vertically overlaps a bottom surface of the opening OP. As a result, the first conductive layer CL1 may be deposited to have a non-uniform thickness, and the upper portion of the opening OP may be narrower than a lower portion thereof due to the overhang. To address this problem, in the present inventive concepts, the overhang may be selectively removed through an ion beam etching process. When an angle θ of an ion beam is greater than or equal to 45 degrees and less than or equal to 80 degrees, redeposition may occur due to a material removed by the ion beam etching. In some example embodiments, redeposition may refer to material that has been etched and deposits onto a bottom of the opening OP. In this case, the ratio of the material removed by the ion beam etching to the material redeposited may be about 4.1:1. When argon is used in ion beam etching, etching damage may be small, and thus, argon may be used to etch various materials.

Figure 11D:
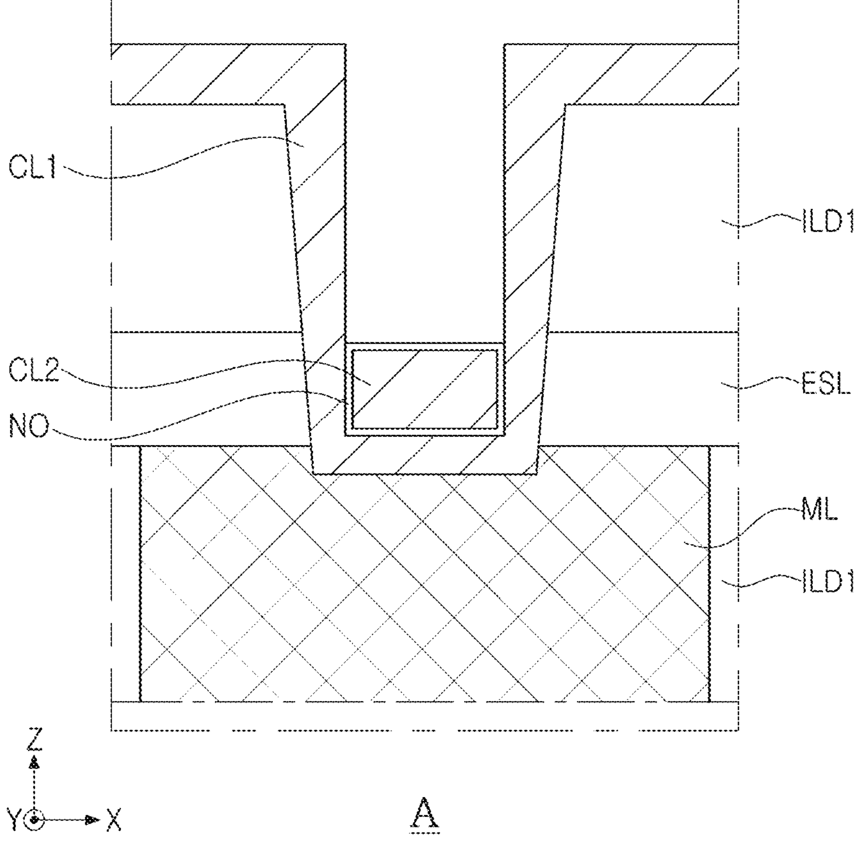

Referring to FIG. 11D, the second conductive layer CL2 may be formed. The second conductive layer CL2 may be formed as a portion of the first conductive layer CL1 removed by ion beam etching is redeposited. Next, the natural oxide layer NO may be formed. The side and lower portions of the natural oxide layer NO may be formed as the first conductive layer CL1 is exposed to the air and oxidized. An upper portion of the natural oxide layer NO may be formed as the second conductive layer CL2 is exposed to the air and oxidized. In this case, the natural oxide layer NO may include metal oxide for the same metal material as metal nitride included in the first and second conductive layers CL1 and CL2. For example, the first and second conductive layers CL1 and CL2 may include titanium nitride, and the natural oxide layer NO may include titanium oxide.

Figure 11E:
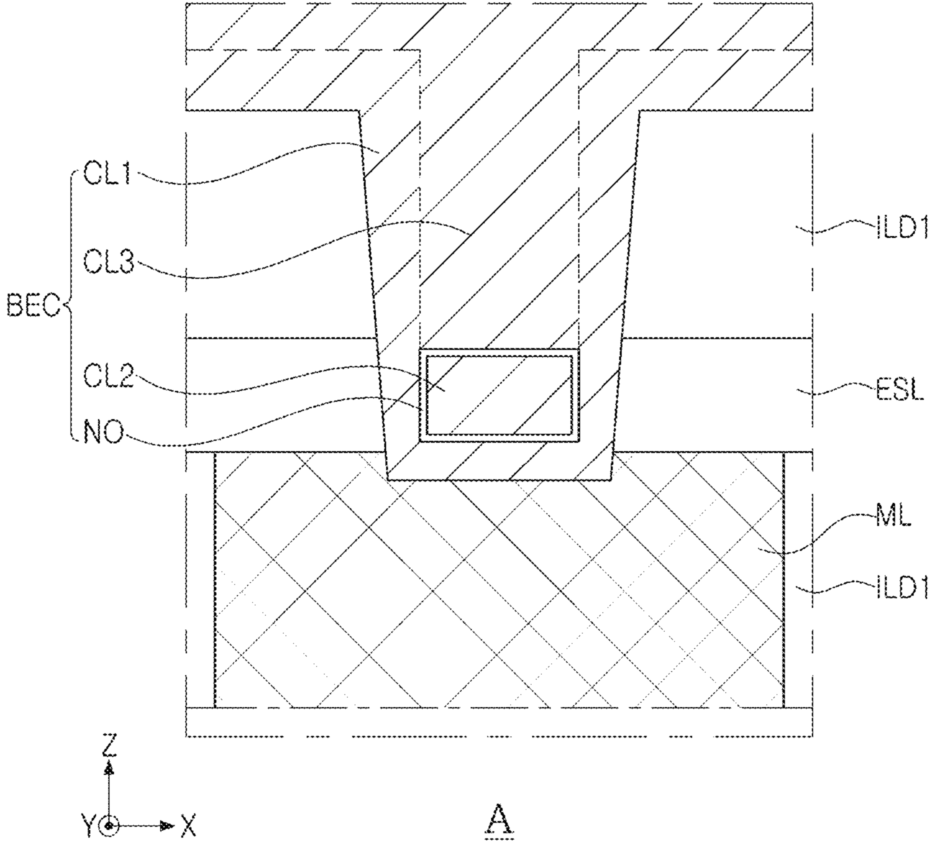

Referring to FIG. 11E, the third conductive layer CL3 may be formed. The third conductive layer CL3 may be formed of the same material as that of the first conductive layer CL1 through a physical vapor deposition process (PVD), a chemical vapor deposition process (CVD), an atomic layer deposition (ALD), spin-coating method, or combinations thereof, but is not limited thereto. According to example embodiments, the third conductive layer CL3 may include a material different from that of the first conductive layer CL1.

Next, referring to FIG. 2, portions of the first conductive layer CL1 and the third conductive layer CL3 may be removed and planarized. For example, in order to obtain a planarized surface, etch-back or chemical mechanical polishing (CMP) may be performed. By the polishing process, upper surfaces of the first conductive layer CL1 and the third conductive layer CL3 may be on the same plane as that of the upper surface of the first interlayer insulating layer ILD1.

Accordingly, the contact structure BEC of FIGS. 1 and 2 may be finally manufactured.

The semiconductor device having improved electrical characteristics and reliability may be provided by forming a contact structure without a seam or void through high-angle ion beam etching.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
an etch stop layer;
an insulating layer on the etch stop layer; and
a contact structure passing through the etch stop layer and the insulating layer,
the contact structure including
a first conductive layer,
a second conductive layer having a side surface and a lower surface facing the first conductive layer,
a third conductive layer on an upper surface of the second conductive layer, and
a natural oxide film between the first conductive layer and the second conductive layer and between the second conductive layer and the third conductive layer,
the first to third conductive layers including metal or metal nitride, and
the natural oxide film including metal oxide.

2. The semiconductor device of claim 1, wherein the second conductive layer includes a same material as that of the first conductive layer.

3. The semiconductor device of claim 2, wherein the third conductive layer includes the same material as that of the first conductive layer.

4. The semiconductor device of claim 2, wherein the third conductive layer includes a material different from that of the first conductive layer.

5. The semiconductor device of claim 1, wherein
the first to third conductive layers include titanium nitride, and
the natural oxide film includes titanium oxide.

6. The semiconductor device of claim 1, wherein the second conductive layer overlaps the etch stop layer in a horizontal direction.

7. The semiconductor device of claim 1, wherein the second conductive layer overlaps the etch stop layer and the insulating layer in a horizontal direction.

8. The semiconductor device of claim 1, wherein the second conductive layer overlaps the insulating layer in a horizontal direction.

9. The semiconductor device of claim 1, wherein the natural oxide film further includes a portion between the first conductive layer and the third conductive layer.

10. The semiconductor device of claim 1, wherein an upper surface of the third conductive layer is on a same level as that of an upper surface of the first conductive layer.

11. The semiconductor device of claim 1, further comprising;
a wiring below the etch stop layer,
wherein the first conductive layer extends below an upper portion of the wiring.

12. The semiconductor device of claim 1, wherein a height of the second conductive layer is greater than or equal to 25% to less than or equal to 200% of a width of the first conductive layer.

13. The semiconductor device of claim 1, wherein a width of the natural oxide film is greater than or equal to 5 Å to less than or equal to 200 Å.

14. The semiconductor device of claim 1, wherein upper and lower surfaces of the natural oxide film are curved to be convex downward.

15. A semiconductor device comprising:
a substrate;
a lower structure on the substrate;
an etch stop layer on the lower structure;
an insulating layer on the etch stop layer;
a contact structure passing through the etch stop layer and the insulating layer; and an information storage structure including a lower electrode, a magnetic tunnel junction pattern, and an upper electrode sequentially stacked on the contact structure, and the contact structure including a first conductive layer, a second conductive layer in an opening passing through the first conductive layer, a third conductive layer on the second conductive layer in the opening, and a natural oxide film surrounding the second conductive layer.

16. The semiconductor device of claim 15, wherein the first to third conductive layers include metal or metal nitride, and the natural oxide film includes metal oxide.

17. The semiconductor device of claim 15, wherein the second conductive layer and the natural oxide layer overlap the magnetic tunnel junction pattern in a vertical direction.

18. The semiconductor device of claim 15, wherein a distance between a lower surface of the magnetic tunnel junction pattern and a lower surface of the second conductive layer is greater than a distance between the lower surface of the magnetic tunnel junction pattern and a lower surface of the third conductive layer.

19. A semiconductor device comprising:

a wiring;

an insulating layer on the wiring; and a contact structure passing through the insulating layer, the contact structure including a first conductive layer, a second conductive layer in an opening passing through the first conductive layer, a third conductive layer on the second conductive layer in the opening, and a natural oxide film surrounding the second conductive layer, the first to third conductive layers including metal or metal nitride, the natural oxide layer including metal oxide, and the wiring being in contact with the first conductive layer and electrically connected to the second and third conductive layers.

20. The semiconductor device of claim 19, wherein the wiring includes tungsten, and the first to third conductive layers include titanium nitride.

* * * * *